Dec. 9, 1969 D. L. SCHAEFER 3,483,108

METHOD OF CHEMICALLY ETCHING A NONCONDUCTIVE MATERIAL USING AN ELECTROLYTICALLY CONTROLLED MASK

Filed May 29, 1967

Inventor:
Donald L. Schaefer,
by John M. Davis
His Attorney.

United States Patent Office 3,483,108

Patented Dec. 9, 1969

3,483,108

METHOD OF CHEMICALLY ETCHING A NON-CONDUCTIVE MATERIAL USING AN ELECTROLYTICALLY CONTROLLED MASK

Donald L. Schaefer, Schenectady, N.Y., assignor to General Electric Company, a corporation of New York Filed May 29, 1967, Ser. No. 641,902
Int. Cl. C23b 3/04, 5/48
U.S. Cl. 204—143 7 Claims

ABSTRACT OF THE DISCLOSURE

A process is disclosed whereby patterns of acid resistant metal films which are analogous to the patterns produced by the conventional "photoresist" process are produced upon the surface of an oxidized silicon wafer and the exposed silicon dioxide is etched away, leaving the silicon dioxide coating intact under the metal film. The metal film is then removed. A modification of this process is disclosed for producing a tapered edge for the retained silicon dioxide pattern elements which is a desirable configuration in the silicon controlled rectifier art.

Figure 1:
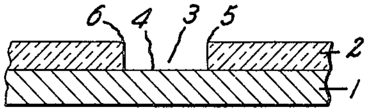

The invention herein described was made in the course of a contract with the Bureau of Ships, United States Navy.

Attention is drawn at this point to copending patent application Ser. No. 275,753, Gaynor, filed Apr. 25, 1963, now U.S. Patent 3,346,384 entitled "Metal Image Formation," to Ser. No. 604,601, Schaefer, filed Dec. 27, 1966, entitled "Photoetching of Gold," Ser. No. 604,596, Schaefer, filed Dec. 27, 1966, Ser. No. 604,541, Schaefer and Burgess, filed Dec. 27, 1966, entitled "Photolytic Etching of Gold," Ser. No. 604,602, Schaefer and Burgess, filed Dec. 27, 1966, entitled "Photolytic Etching of Nickel-Chromium Alloy," and Ser. No. 604,596, Schaefer, filed Dec. 27, 1966, entitled "Photodeposition of Metal," all assigned to the assignee of the present application.

BACKGROUND OF THE INVENTION

In the past when it has been desired to etch the surface of glass or quartz materials for either decorative or optical purposes, or to etch patterns through silicon dioxide surface films formed on the surfaces of so-called silicon "chips" for use as semiconductive circuit elements in miniaturized "integrated" circuits, it has been necessary to coat those areas which are not to be etched with a protective layer of a material which is resistant to the etchant, leaving exposed those areas which are to be etched. The etchant, usually hydrofluoric acid or a solution with ammonium fluoride is then applied and etching of the surface is accomplished in those exposed areas. Where a high degree of precision is necessary in forming the etched pattern as, for example, in the manufacture of optical reticles or in the manufacture of silicon chips, it has been conventional to use a suitable "photoresist" process. In general, these processes have involved coating the surface to be etched with a material which, when suitably irradiated, is converted from a soluble to an insoluble material. In practice, the surface to be etched is coated with the material, exposed to the desired pattern of activating radiation through an appropriate photographic negative, for example, and the unexposed still soluble areas of the coating removed by washing with an appropriate solvent, leaving behind the insoluble coating covering the surface areas which were exposed. The unprotected areas of the surface may then be etched with the etchant, after which the photoresist mask is removed. It will be apparent that this process has several inherent disadvantages. The photolytic reaction of the photoresist materials usually involves a polymerization or cross-linking type of reaction and the edge resolution between reacted and unreacted zones is frequently of uncertain quality and may be difficult to reproduce with a high degree of accuracy from one specimen to another. Considerable care must be exercised during the washing and the etching steps to prevent the insoluble portions of the photoresist pattern from lifting from the surface, yet all the soluble material must be removed. Undercutting of the insoluble pattern by the etchant is unavoidable and virtually impossible to control which introduces variations between successively etched patterns. The etchants conventionally employed in the etching of silicon dioxide are known to attack the usual photoresist materials in varying degrees. It would therefore be advantageous to provide resist patterns which are more resistant to attack by the etchants, are more reproducible in quality and edge resolution than conventional materials, and in which the rate of etching may be controlled to produce effects such as tapered edges, for example.

It is therefore a principal object of this invention to provide a process for producing "resist" patterns or masks on surfaces composed essentially of silicon dioxide which are composed of thin films of metals which are resistant to attack by the etchants employed in subsequent etching operations.

A further object of the invention is the provision of a process for etching patterns in surfaces composed principally of silicon dioxide wherein controlled tapered edges are produced in the etched pattern.

A yet further object of the invention is the provision of articles comprised of silicon dioxide having patterns etched in their surfaces which etched patterns are characterized by tapered edges.

Other and specifically different objects of this invention will become apparent to those skilled in the art from the following disclosure taken in conjunction with the accompanying drawing, in which:

FIG. 1 is a semischematic cross-section of a portion of an etched pattern in a silicon dioxide film supported by a silicon body as conventionally produced, and FIGS. 2 through 7 illustrate the various steps employed in the practice of this invention whereby controllably tapered edges are produced in an etched pattern which is analogous to that shown in FIG. 1.

SUMMARY OF THE INVENTION

Briefly stated, this invention provides for the selective etching of patterns in silicon dioxide utilizing patterns of metal films deposited or formed on the surface of the silicon dioxide member which are resistant to attack by the etchant. These patterns may be formed by vapor depositing a uniform coating of the metal over the entire surface and then selectively removing portions of the film by a photolytic etching technique to form the pattern or mask, or alternatively the desired pattern of metal film may be directly deposited upon the surface in its final form by a photolytic plating technique. The use of these photolytic techniques permits the formation of graded or tapered edge formation of the etch pattern which is not possible with conventional photoresist etching techniques and which provides a highly desirable configuration, particularly for use in silicon controlled rectifiers and analogous applications.

DESCRIPTION OF THE PREFERRED EMBODIMENT

More particularly, the invention may be practiced in the following specific manner. In the manufacture of semiconductive silicon electrical elements such as, silicon controlled rectifiers (SCR), it is conventional to form a layer of electrically insulating silicon dioxide on one surface of a wafer or chip of elemental silicon and then to etch through the oxide layer in selected zones or areas utilizing the previously described "photoresist" method. In FIG. 1, a somewhat idealized showing is made of a cross-section of one such etched areas wherein the body of semiconductive silicon 1 is provided with an overlying layer of silicon dioxide 2 which has been etched away in area or zone 3 exposing the upper surface of the silicon body to provide a junction area 4. As shown, the corners 5 and 6 of the unetched oxide layer adjacent the etched zone are illustrated as having a sharp, angular configuration. It will be of course appreciated that the relative dimensions of the thicknesses of the layers have been exaggerated for purposes of illustration and that the probability of finding an exactly square corner configuration as shown at 5 and 6 is not great; however, configurations approaching that are quite probable. It would be desirable in the manufacture of such devices if a tapered edge configuration could be controllably and reproducibly achieved in order to improve the hold-off capability of such SCR devices by reducing voltage stresses in junction areas.

Figure 2:
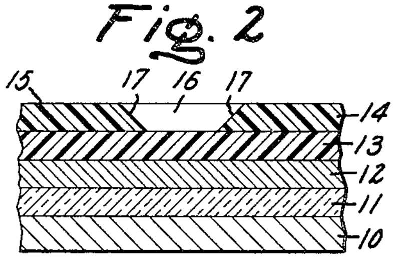

The desired tapered or graduated edge configuration may be conveniently achieved in the following manner. As shown in FIG. 2, a semiconductive wafer or chip of silicon 10 is provided with an overlying adherent coating of silicon dioxide 11 of appropriate and uniform thickness. A uniform layer or film 12 of a metal which is resistant to attack by etchants for silicon dioxide, such as hydrofluoric acid, for example, is deposited upon the surface of the silicon dioxide layer as shown. For purposes of illustration, the metal may be gold and deposited by known vapor deposition techniques. A film 13 comprising a polymeric material containing a photolytically decomposable etchant for gold is cast upon the upper surface of layer 12 in the manner more specifically set forth, for example, in copending application Ser. No. 604,541, previously referred to. More specifically and as an example, the surface of the gold may be overcoated with a solution of 0.2 gram of N,N-dibromodimethyl hydantoin in 5 cc. of "Carboset No. 525" (a water soluble thermoset acrylic resin) in methanol. The film is then dried in an oven at 85° C. for about 10 minutes. A photographic transparency 14 is then placed over the film 13, as shown in FIG. 1. The transparency 14 is composed of opaque zones schematically shown at 15, 15, a transparent zone 16 and zones 17, 17 of graduated transparency or opacity between zones 15 and 16, so as to take advantage of the "grey scale" sensitivity of the photoetching process.

Figure 3:
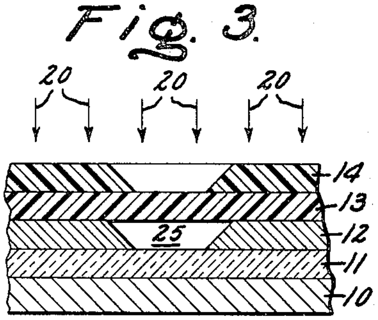

As illustrated in FIG. 3, the photolytically reactive film 13 is exposed to activating radiation as schematically shown by arrows 20 from, for example, a 500 watt tungsten filament projector, for a time which is dependent upon the thickness of the gold film whereby chemically reactive species are photolytically generated in film 13 in concentrations which are proportional to the level of illumination. Film 12 is attached and etched by said reactive species at a rate which is proportional to the concentration of the species to produce an etched zone 25 in the film having the configuration shown. The transparency 14 is removed and the polymer film 13 is dissolved away along with any etching products remaining in zone 25. The remaining gold forms an acid resistant pattern or mask for subsequent etching and is characterized by the tapered edge configuration shown at 26, 26.

Figure 5:
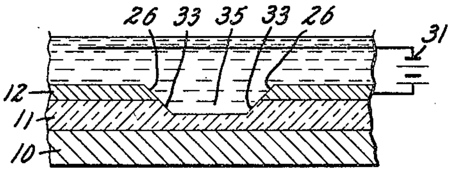
Figure 6:
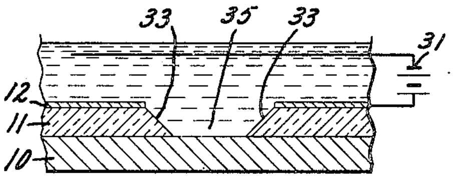
Figure 7:
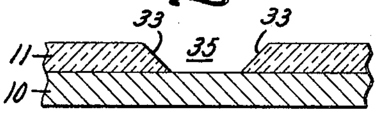
Figure 4:
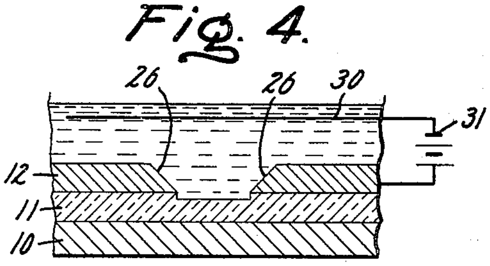

As shown in FIG. 4, an etchant 30 such as a solution of hydrofluoric acid is applied to the surface and attacks the exposed surface of silicon dioxide. Substantially simultaneously, the remaining gold film is made the anode of an electrolytic deplating circuit shown schematically at 31 and the thickness of the gold is gradually reduced thereby as the etching proceeds. The gold is uniformly removed from all the exposed surfaces of the film by this process and consequently tapered edges 33, 33 are etched in the opening 35 in a progressive manner as shown in FIGS. 5, 6 and 7, to produce the desired configuration.

While for the purposes of illustration, gold has been specifically disclosed as the metal film, any metal which can be photolytically etched and which is resistant to attack by the etchant used to etch the silicon dioxide film may be used. Such metals and photolytic etchants therefore have been disclosed in the previously identified copending patent applications.

In addition, while a photolytic etching process has been disclosed for producing a metal mask or resist pattern having the tapered edge configuration shown at 26, 26 in FIG. 4, it will be obvious that a gold film pattern having a similar tapered edge configuration may be directly deposited upon the surface of the silicon dioxide layer by means of the process disclosed in the previously referenced copending application Ser. No. 604,596. As disclosed in greater detail in the application, a photoplated film pattern may be deposited upon the silicon dioxide surface by immersing the body in a liquid solution comprising a photolytically reactive material which is the source of the metal to be plated and the surface of the silicon dioxide layer is irradiated with activating radiation through a transparency to project a pattern of illumination on the interface formed between the solid silicon dioxide layer and the liquid. A metallic film is deposited upon those areas of the silicon dioxide layer which are illuminated but not on the non-illuminated areas and the thickness of the film deposited is related to the intensity of the illumination and the length of time of the exposure, whereby "grey scale" is achieved in the deposited metal film which corresponds to shade tones in the transparency. It will thus be seen that a transparency would be needed which would be the photographic negative, or one having a pattern of transparency, grey scale and opacity, which would be the reverse of that shown at 14 in FIG. 2.

More specifically, a suitable liquid for use in the photoplating process disclosed may be prepared by photolytically reacting a 0.1 molar solution of N-chlorosuccinimide in methanol with gold foil therein by exposing it to ultraviolet radiation. The solution is quite stable in room light. The silicon dioxide coated body is immersed in this solution and the surface of the silicon dioxide is exposed through an appropriate transparency to radiation from, for example, a 200 watt high pressure xenon light source for an appropriate length of time, depending upon the desired thickness of the gold film. After the gold film pattern having the edge configuration shown in FIGS. 3 and 4 is removed from the photoplating solution, it is employed in the same manner as previously described with respect to FIGS. 4 through 6 to produce an etched pattern in the silicon dioxide layer having the edge configuration shown in FIG. 7.

While the foregoing procedure has disclosed removal of the metal film by an electrolytic deplating technique, it will be apparent to those skilled in the art that the metal film may be chemically removed simultaneously with the etching of the silicon dioxide.

From the foregoing it will be apparent that a method has been disclosed for providing for a desirable tapered edge configuration of openings or apertures etched through an otherwise continuous layer of a non-metallic substance such as silicon dioxide. It will become apparent to those skilled in the art that certain departures may be made from the specific examples disclosed for purposes of illustration within the scope of the invention and it is not intended that the invention be limited in any way except as defied in the following claims.

What I claim as new and desire to secure by Letters Patent of the United States is:

1. The method of etching comprising the steps of providing an electrically nonconductive substrate with an overlying metallic film comprising an etching mask which is provided with at least one opening therethrough having a tapered edge configuration, contacting the surface of said substrate which is exposed by said opening with an etchant which chemically attacks and dissolves said substrate material but is relatively inert with respect to said metal film, and simultaneously removing metal from all of the exposed surfaces of said metal film in a substantially uniform rate by electrolytic deplating as the etching of the substrate progresses.

2. The method set forth in claim 1 wherein said non-metallic substrate is composed of silicon dioxide.

3. The method set forth in claim 2 wherein said silicon dioxide substrate comprises a layer supported by an underlying body.

4. The method set forth in claim 3 wherein said body is composed of semiconductive elemental silicon.

5. The method set forth in claim 1 wherein said opening in said metallic film is comprised of side walls which converge toward each other as they approach said substrate.

6. The method set forth in claim 5 wherein said metallic film is composed of gold and said substrate is silicon dioxide.

7. The method set forth in claim 6 wherein said substrate is supported on a surface of a body comprising semiconductive elemental silicon.

References Cited

UNITED STATES PATENTS

| | | | |
|---|---|---|---|
| 2,469,689 | 5/1949 | Gresham | 204—143 |
| 2,656,496 | 10/1953 | Sparks | 204—143 |
| 3,245,313 | 4/1966 | Zaromb | 204—22 |
| 3,346,384 | 10/1967 | Gaynor | 96—36 |
| 3,405,017 | 10/1968 | Gee | 156—17 |
| 3,423,262 | 1/1969 | Barditch et al. | 156—17 |

ROBERT K. MIHALEK, Primary Examiner

U.S. Cl. X.R.

96—36, 36.4; 156—17; 204—15